(12) United States Patent
Howard et al.

(10) Patent No.: US 7,241,663 B2
(45) Date of Patent: Jul. 10, 2007

(54) MASKLESS MULTIPLE SHEET POLYSILICON RESISTOR

(75) Inventors: Gregory Eric Howard, Dallas, TX (US); Leland Swanson, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 183 days.

(21) Appl. No.: 11/109,231

(22) Filed: Apr. 19, 2005

(65) Prior Publication Data

US 2006/0234439 A1 Oct. 19, 2006

(51) Int. Cl.
*H01L 21/00* (2006.01)
(52) U.S. Cl. ............... 438/382; 438/238; 257/E21.004
(58) Field of Classification Search ........ 438/381–385, 438/238; 257/E21.004
See application file for complete search history.

(56) References Cited

U.S. PATENT DOCUMENTS

| | | | |
|---|---|---|---|
| 4,209,764 A | 6/1980 | Merz et al. | |
| 4,291,328 A | 9/1981 | Lien et al. | |
| 4,370,798 A | 2/1983 | Lien et al. | |
| 4,411,708 A | 10/1983 | Winhan | |
| 4,464,825 A | 8/1984 | Ports | |
| 4,868,537 A | 9/1989 | Blanchard | |
| 5,126,279 A | 6/1992 | Roberts | |
| 5,424,239 A * | 6/1995 | Sweeney | 438/385 |
| 5,656,524 A | 8/1997 | Eklund et al. | |
| 6,242,314 B1 | 6/2001 | Chen et al. | |
| 6,306,718 B1 | 10/2001 | Singh et al. | |
| 6,351,021 B1 | 2/2002 | Hemmenway et al. | |
| 6,403,438 B1 * | 6/2002 | Santangelo | 438/383 |
| 6,624,079 B2 | 9/2003 | Tsai et al. | |
| 6,700,474 B1 | 3/2004 | Leibiger | |
| 6,812,108 B2 | 11/2004 | Hemmenway et al. | |

* cited by examiner

*Primary Examiner*—H. Jey Tsai
(74) *Attorney, Agent, or Firm*—Peter K. McLarty; W. James Brady, III; Frederick J. Telecky, Jr.

(57) ABSTRACT

The present invention facilitates semiconductor fabrication of semiconductor devices having polysilicon resistors. An oxide layer is formed over a semiconductor device (104). A polysilicon layer is formed on the oxide layer (106). The polysilicon layer is patterned to form a polysilicon resistor (108). A poly resistor mask having a selected percentage of the poly resistor exposed is formed on the poly resistor (110). A selected dopant is implanted (112), which modifies the resistivity of the poly resistor. The mask is removed (114) and a thermal activation process is performed (116) that diffuses the implanted dopant to a substantially uniform concentration throughout the polysilicon resistor.

23 Claims, 11 Drawing Sheets

MASKLESS MULTIPLE SHEET POLYSILICON RESISTOR

FIELD OF INVENTION

The present invention relates generally to semiconductor devices and more particularly to polysilicon resistors and fabrication thereof.

BACKGROUND OF THE INVENTION

Semiconductor device fabrication involves performing a variety of processes, procedures and operations in order to achieve a fabricated device. These operations include, but are not limited to, layering, doping, heat treatments, and patterning. Layering is the operation used to add layers of a selected thickness to a wafer surface. These layers can be insulators, semiconductors, conductors, and the like and can be grown or deposited by a number of suitable methods (e.g., chemical vapor deposition, sputtering, and the like).

Doping is the process that introduces specific amounts of dopants in the wafer surface through openings in surface layers. Two general techniques of doping are thermal diffusion and ion implantation. Doping is used, for example, to create active regions in transistors.

Heat treatments are operations in which a wafer is heated and cooled to achieve specific results. Generally, no additional material is added although contaminates and vapors may evaporate from the wafer surface. A common heat treatment is called an anneal which is typically employed to repair damage to crystal structures introduced by ion implantation.

Patterning is the operation that employs a series of steps that results in the removal of selected portions of added surface layers. The series of steps includes first forming a layer of resist or photoresist over a semiconductor device. Then, a resist mask or reticle is aligned with the device. Subsequently, the layer of resist is exposed or irradiated through the resist mask, which selects portions of the layer of resist that are later removed to expose underlying portions of the device. Continuing, a fabrication process, such as ion implantation, ion diffusion, deposition, etching, and the like is performed on exposed portions of the device.

Semiconductor devices typically include transistor devices, such as MOS and CMOS devices, and resistors. Many transistor devices have gate electrodes formed with polysilicon material. Similarly, many resistors are also formed with polysilicon material and are, therefore, referred to as polysilicon resistors or poly resistors. The polysilicon gate electrodes are doped with a particular dopant type and amount to obtain desired transistor behavior. The polysilicon resistors are doped with a particular dopant type and amount to obtain a selected contact resistance and overall resistance. However, dopant types and amounts employed for the gate electrodes are generally different than the dopant types and amounts employed for the polysilicon resistors. Furthermore, polysilicon resistors on a semiconductor device can be designed with differing contact resistance and resistance thereby requiring varied dopant types and/or dopant concentrations. Unfortunately, obtaining these varied dopant types and/or amounts requires discrete doping processes, including ion implantation and diffusion, which typically require separate masks and patterning operations. As a result, a substantial number of extra processing steps are typically employed to fully form the polysilicon gates and the polysilicon resistors because of the varied dopant types and/or amounts employed for each.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by forming polysilicon resistors having varied sheet resistance values in a single mask, single doping operation. The present invention employs masks that selectively expose portions of polysilicon resistor structures thereby controlling dopant concentration, instead of employing discrete ion doping processes to achieve varied concentrations.

In accordance with one aspect, a layer of polysilicon is formed on an oxide layer. The layer of polysilicon is patterned leaving a polysilicon resistor. A poly resist mask is formed that exposes only a portion of the polysilicon resistor. Subsequently, a doping process, such as ion implantation, is performed with a suitable dopant (e.g., an n type dopant such as BF2). A thermal process is then performed that activates the implanted dopant and causes the dopant to diffuse through the polysilicon resistor. Polysilicon has a relatively high diffusability that allows the implanted ions, which are initially in varied concentration, to be more uniformly spread throughout the polysilicon resistor after performing the thermal process. Other aspects of the invention are also disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
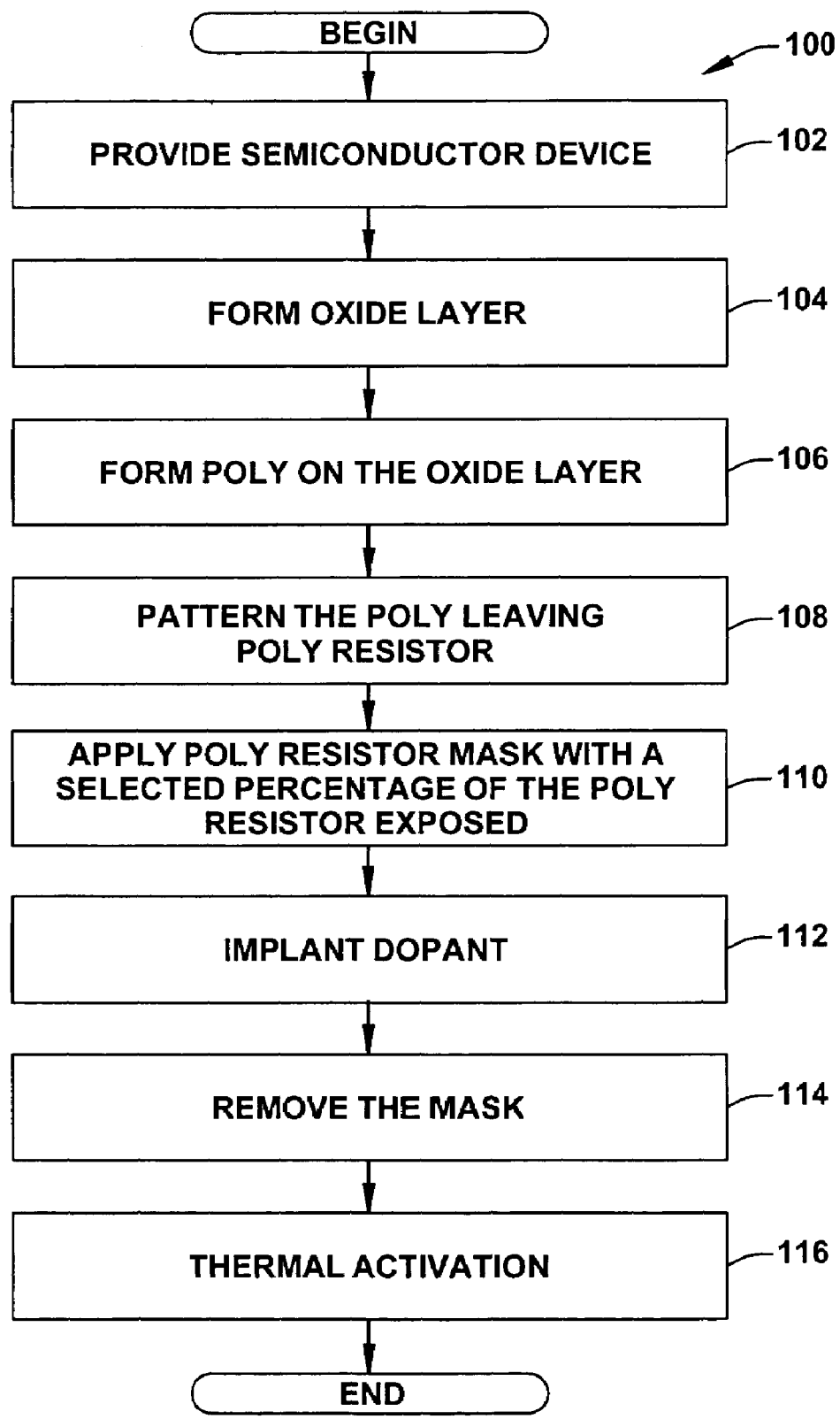
FIG. 1 is a flow diagram illustrating a method of forming a polysilicon resistor in accordance with an aspect of the present invention.

One or more implementations of the present invention will now be described with reference to the attached drawings, wherein like reference numerals are used to refer to like elements throughout, and wherein the illustrated structures are not necessarily drawn to scale.

Forming polysilicon resistors on the same wafer/device as other circuit components can be difficult. One reason is that the thickness of the polysilicon layer is generally determined by the required characteristics of other devices. For example, the deposited polysilicon is also employed to form the gates and/or emitters of active components and capacitor plates. This can require thicknesses greater than, for example 200 nanometers.

Polysilicon resistivity is a non-linear function of doping wherein the resistivity decreases as the doping dose increases. This resistivity, also referred to as sheet resistance, is expressed in ohms-cm and has an upper limit based on implant dose control (e.g., 0.060 ohm-cm). The resistance is a function of the resistivity divided by the thickness.

The inventors of the present invention note that resistance of polysilicon resistors is generally determined by thickness and implanted dopant concentration. The thickness, as described above, is usually determined by other components present on a device/wafer. As a result, only the dopant concentration remains as an available mechanism to control resistance. Conventionally, implant type and dose were typically employed in order to control dopant concentration and, therefore resistance. As a result, several doping process steps were typically employed in order to form one or more polysilicon resistors.

The inventors of the present invention can employ a single doping process for one or more polysilicon resistors and obtain a range of sheet resistance values. Further, the single doping process can be one employed for already existing doping processes such as, for example, source/drain region formation, extension region formation, and the like. Instead of performing, for example, ion implantation on an entire polysilicon resistor, the present invention implants ions only in selected portions of the polysilicon resistor such that its overall or average dopant concentration is less than if the entire polysilicon resistor had been implanted. A subsequent thermal process, the inventors note, causes the implanted dopants to uniformly diffuse through the polysilicon resistor due to the high deferability of polysilicon. As a result, the present invention can control dopant concentration by selectively exposing only portions of the polysilicon resistors to implantation and, as a result, can control resistance of the polysilicon resistors.

FIG. 1 is a flow diagram illustrating a method 100 of forming a polysilicon resistor in accordance with an aspect of the present invention. The method 100 selective exposes a portion or percentage of a polysilicon resistor during an implantation process in order to control dopant concentration and, as a result, resistivity of the resistor.

The method 100 begins at block 102, wherein a semiconductor device/body is provided. The semiconductor device can have other devices, including MOS transistor devices, capacitors, and the like that are partially fabricated. An oxide layer is formed over the device at block 104. The oxide layer serves to protect underlying layers, which can include active components, semiconductor substrate, and the like.

A polysilicon layer is formed on the oxide layer at block 106 and has a selected thickness. The polysilicon layer can be formed as undoped or doped by incorporating a dopant during formation. Subsequently, the polysilicon layer is patterned at block 108 removing portions and leaving a selected portion, a polysilicon resistor. The thickness of the polysilicon layer is typically selected according to other components, such as polysilicon gate layers, formed on the device.

A polysilicon resistor mask is applied to the semiconductor device at block 110 that exposes a selected portion and/or percentage of the polysilicon resistor while covering other portions of the resistor. The polysilicon resistor mask can also be a portion of a mask employed in fabricating other components on the device, such as forming source/drain regions. The amount or percentage of the polysilicon exposed by the resistor mask is a function of a desired dopant concentration, the selected thickness of the polysilicon layer, and dopant species and dose employed in a later ion implantation.

Continuing the method 100 at block 112, a dopant is implanted into the exposed portions of the polysilicon resistor. A dose and energy of the implant are typically selected according to other components being formed on the device, such as extension regions and/or source drain regions. The dopant employed in the implant is typically an n-type dopant, such as Phosphorous or BF2. Then, the polysilicon resistor mask is removed at block 114 by a suitable resist removal process. Subsequently, a thermal activation process is performed at block 116 that activates and diffuses dopants implanted within the polysilicon resistor. As stated above, polysilicon has a high diffusability. As a result, the implanted dopants diffuse to non-exposed portions of the polysilicon resistor to obtain a more uniform dopant concentration throughout the polysilicon resistor. Generally, the longer the duration of the thermal process and the greater the temperature of the thermal process, the more diffusion of the implanted dopants is obtained. Subsequently, fabrication of the polysilicon resistor and the device continues with other processes including, but not limited to, contact formation.

It is appreciated that the method 100 can be performed so as to form multiple polysilicon resistors simultaneously. In such a case, different polysilicon resistors have their resistivity controlled by the amount or percentage of the polysilicon resistor exposed by the resist mask at block 110. It is also appreciated that variations in the method 100 are permitted in accordance with the present invention.

Figure 2:
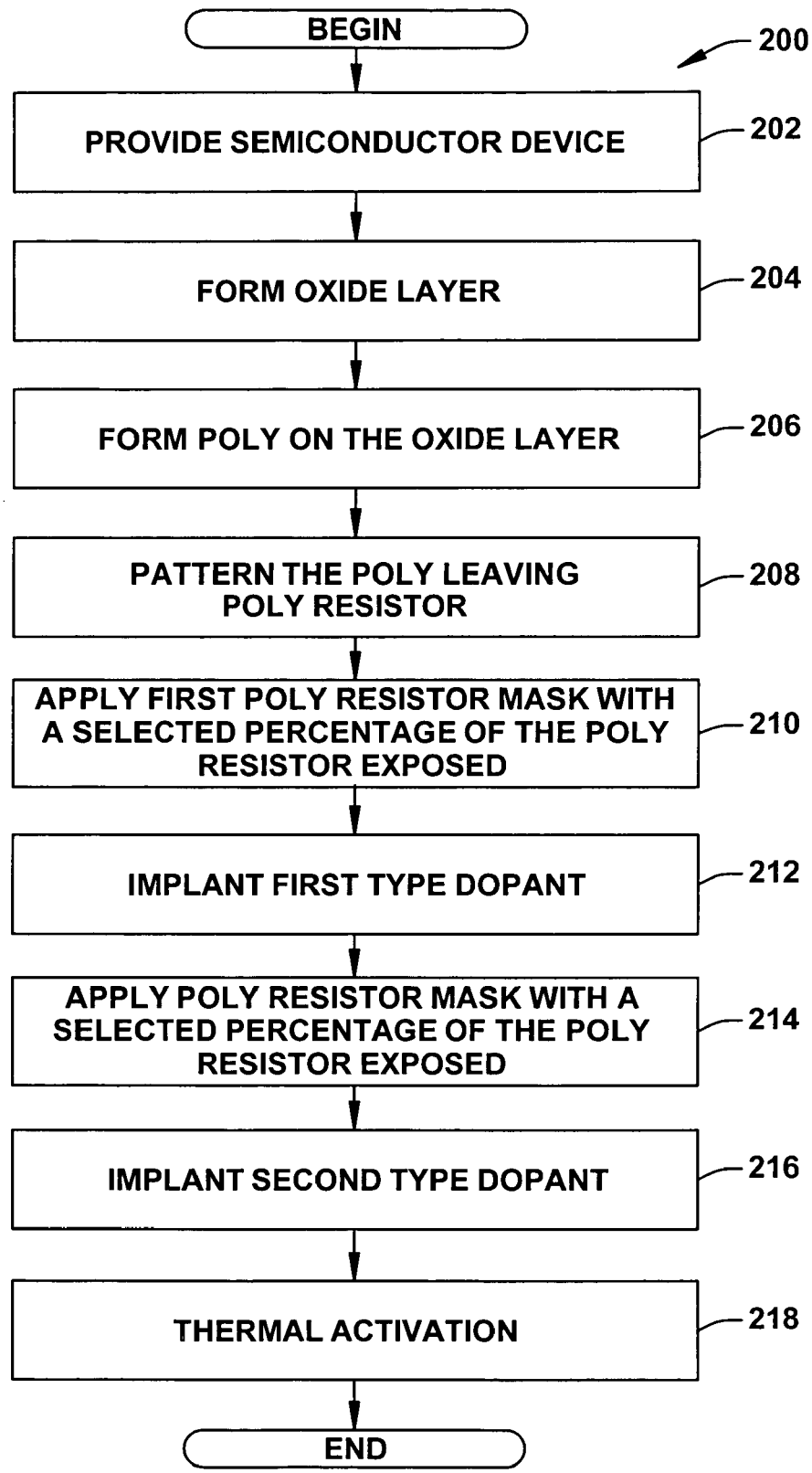
FIG. 2 is a flow diagram illustrating a method of fabricating a low temperature coefficient of resistance polysilicon resistor in accordance with an aspect of the present invention.

FIG. 2 is a flow diagram illustrating a method 200 of fabricating a low temperature coefficient of resistance polysilicon resistor in accordance with an aspect of the present invention. Generally, polysilicon resistivity either increases or decreases with increasing temperature. This rate of increase is referred to as a temperature coefficient of resistance. The method 200 mitigates this affect by doping the polysilicon resistor with both n-type and p-type dopants.

Beginning at block 202, a semiconductor device/body is provided. The semiconductor device can have other devices, including MOS transistor devices, capacitors, and the like that are partially fabricated. An oxide layer is formed over the device at block 204. The oxide layer serves to protect underlying layers, which can include active components, semiconductor substrate, and the like and also to electrically isolate the polysilicon resistor.

A polysilicon layer is formed on the oxide layer at block 206 and has a selected thickness. The polysilicon layer can be formed as undoped or doped by incorporating a dopant during formation. Subsequently, the polysilicon layer is patterned at block 208 removing portions and leaving a selected portion, the polysilicon resistor. The thickness of the polysilicon layer is typically selected according to other components, such as polysilicon gate layers, formed on the device.

A first polysilicon resistor mask is applied to the semiconductor device at block 210 that exposes a first selected portion and/or percentage of the polysilicon resistor while covering other portions of the resistor. The first polysilicon resistor mask can also be a portion of a mask employed in fabricating other components on the device, such as forming first type source/drain regions. The amount or percentage of the polysilicon exposed by the first resistor mask is a function of a desired net dopant concentration, the selected thickness of the polysilicon layer, and dopant species and dose employed in later ion implantations.

Continuing the method 200 at block 212, a first dopant is implanted into the exposed portions of the polysilicon resistor. A dose and energy of the implant are typically selected according to other components being formed on the device, such as extension regions and/or source drain regions. The dopant employed in the implant is typically n-type or p-type. Subsequently, the polysilicon resistor mask is removed.

A second polysilicon resistor mask is then applied to the semiconductor device at block 214 that exposes a second selected portion and/or percentage of the polysilicon resistor while covering other portions of the resistor. The second polysilicon resistor mask can also be a portion of a mask employed in fabricating other components on the device, such as forming second type source/drain regions. The amount or percentage of the polysilicon exposed by the second resistor mask is a function of a desired net dopant concentration, the selected thickness of the polysilicon layer, dopant species and dose employed in a later ion implantation, and dopant species and dose employed the previous first ion implantation. Additionally, the amount or percentage exposed by the second resistor mask may or may not be equal to the amount exposed by the first resistor mask. In one alternate aspect of the invention, the first resistor mask and the second resistor mask are the same.

A second dopant is implanted into the exposed portions of the polysilicon resistor at block 216. Similarly, a dose and energy of the second implant are typically selected according to other components being formed on the device. The dopant employed in the second implant is typically n-type or p-type and is opposite in conductivity type from the first dopant. After the second implantation, the polysilicon resistor mask is removed.

A thermal activation process is performed at block 218 that activates and diffuses dopants implanted within the polysilicon resistor. Polysilicon has a high diffusability, which results in the first and second implanted dopants diffuse to non-exposed portions of the polysilicon resistor to obtain a more uniform dopant concentration throughout the polysilicon resistor. Generally, the longer the duration of the thermal process and the greater the temperature of the thermal process, the more diffusion of the implanted dopants is obtained.

The implantations of the first and second dopants and the thermal activation process result in a net conductivity for the polysilicon resistor. Typically, the concentration of n-type dopant is higher than the concentration of p-type dopant. Subsequently, fabrication of the polysilicon resistor and the device continues with other processes including, but not limited to, contact formation.

Figure 3A:
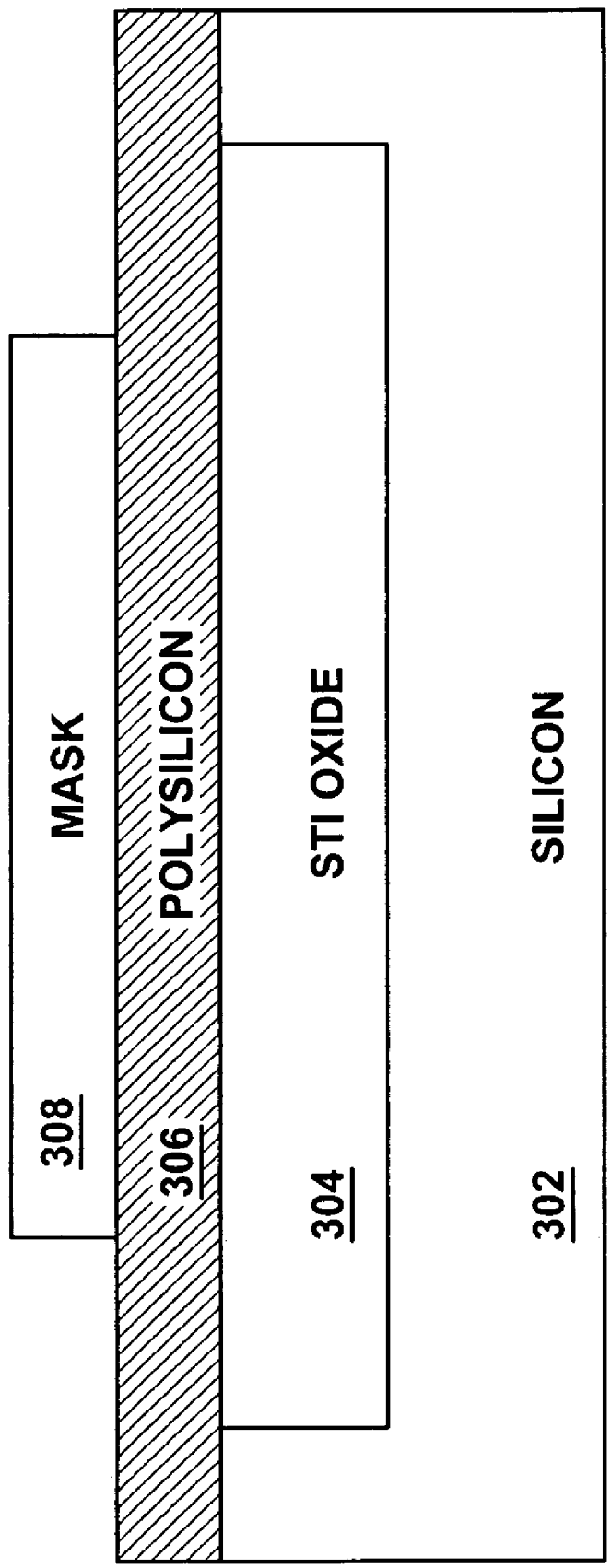
FIG. 3A depicts the polysilicon resistor device after formation of a polysilicon layer 306 during a patterning process in accordance with an aspect of the present invention.
Figure 3B:
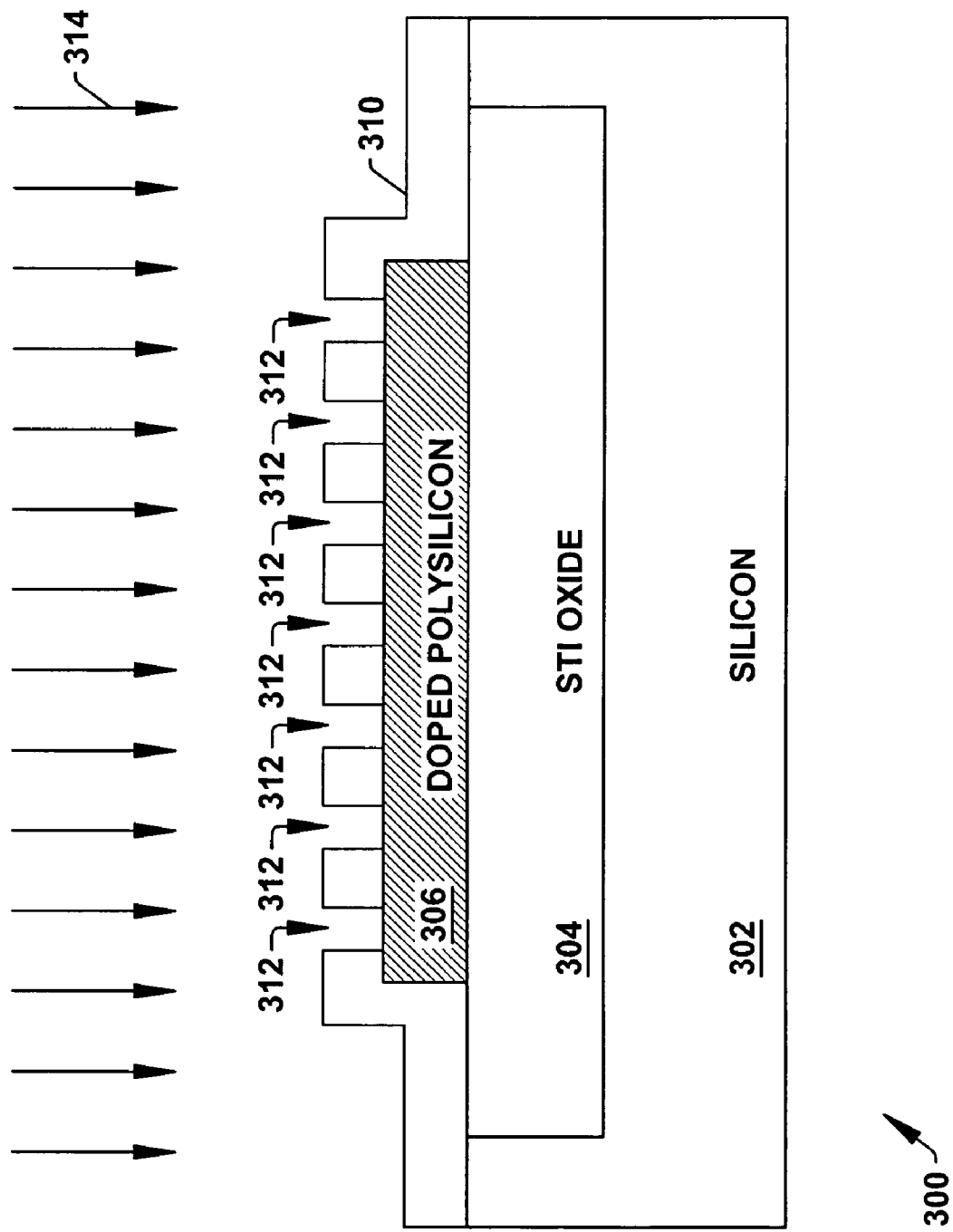
FIG. 3B illustrates the polysilicon resistor device during ion implantation in accordance with an aspect of the present invention.
Figure 3C:
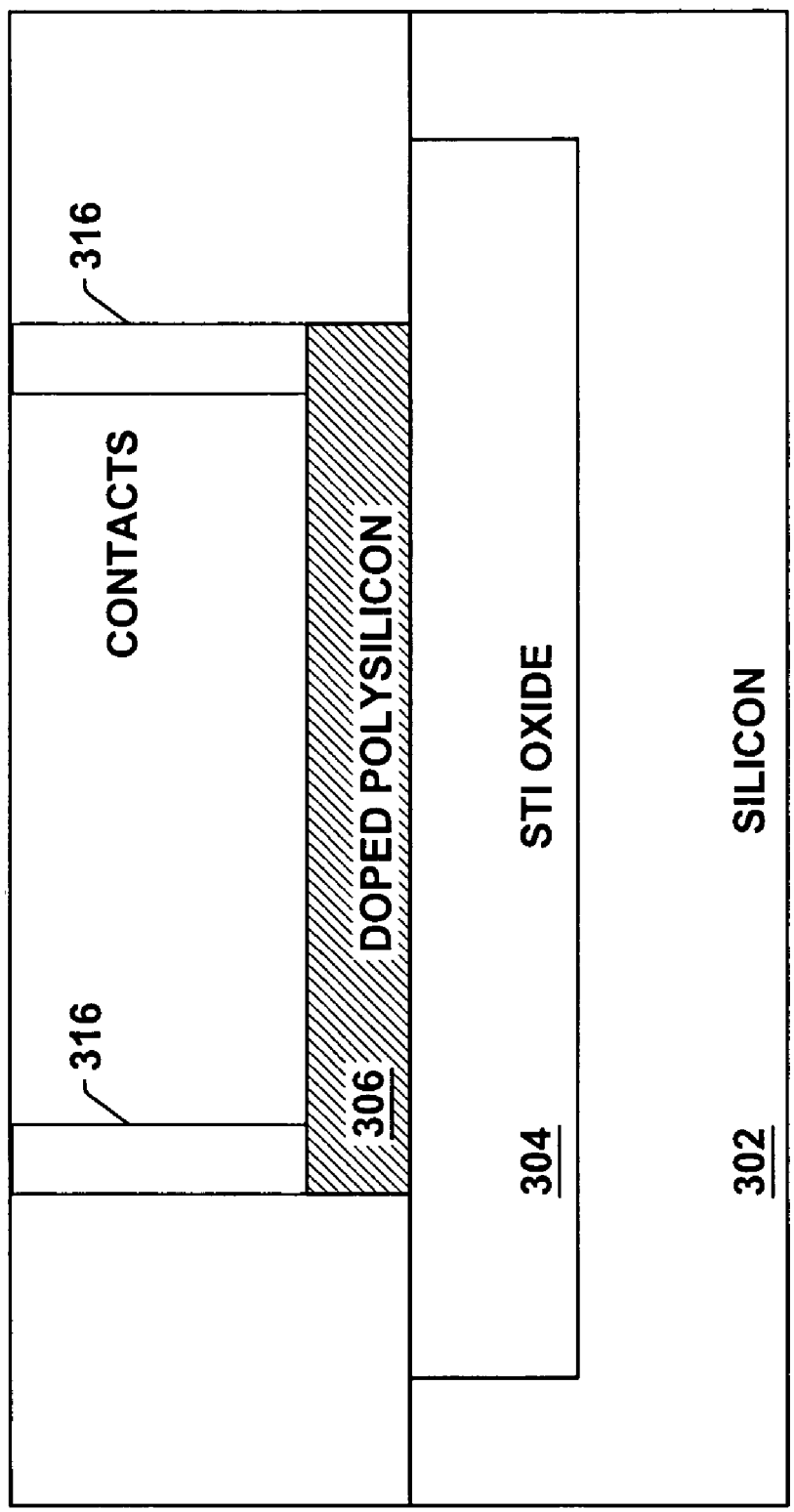
FIG. 3C illustrates the polysilicon resistor device after formation of contacts 316 in accordance with an aspect of the present invention.

FIGS. 3A, 3B, and 3C depict a polysilicon resistor semiconductor device 300 being fabricated via the method 100 of FIG. 1 or the method 200 of FIG. 2. The device 300 is provided and described to facilitate understanding of the present invention and is exemplary in nature.

FIG. 3A depicts the polysilicon resistor device after formation of a polysilicon layer 306 during a patterning process in accordance with an aspect of the present invention. A shallow trench isolation oxide 304 is formed within a semiconductor substrate or body 302 comprised of silicon, in this example. It is appreciated that other types of oxide layers can be employed in place of the shallow trench isolation oxide 304 and in accordance with the present invention.

The polysilicon layer 306 is formed over/on the oxide layer 304 by a suitable deposition process. Subsequently, a mask 308 is aligned that covers/protects a selected portion of the polysilicon layer 306 and exposes other portions of the polysilicon layer 306. Subsequently, an etch process that is selective to the oxide 304 and the substrate 302 is performed to remove the exposed portions of the polysilicon layer 306. Afterwards, the mask 308 is removed.

FIG. 3B illustrates the polysilicon resistor device 300 during ion implantation in accordance with an aspect of the present invention. A resist mask 310 is formed over the polysilicon resistor 306, which is the remaining portion of the polysilicon layer. The resist mask 310 has several openings 312 that expose a portion or percentage of the polysilicon resistor 306, which are also referred to as an exposure pattern. The openings 312 are typically uniformly spaced across the polysilicon resistor 306 so as to facilitate uniform dopant distribution of implanted dopants. The size, shape, and frequency can be varied as discussed below.

An ion implantation 314 implants a selected dopant, such as BF2, at a particular dose and energy level. The dopant(s) pass through the openings 312, but are blocked by other portions of the resist mask 310. As a result, only a portion of the ions directed at the polysilicon resistor 306 are implanted in the polysilicon resistor 306. The total amount of ions implanted into the polysilicon resistor 306 are as if a lower dose ion implantation was performed. However, the concentration of the implanted ions is not uniform throughout the polysilicon resistor. Exposed portions of the polysilicon resistor 306 have pockets of higher than desired concentrations of the implanted dopant and covered portions of the polysilicon resistor 306 have none or less than desired concentrations of the implanted dopant.

For a low temperature coefficient polysilicon resistor, another second resistor mask is employed and a second ion implantation is performed to implant a second dopant of an opposite type of the first implantation.

Subsequent to the implantation 314, the resist mask 310 is removed by a suitable process (e.g., chemical solution). Then, a thermal activation process is performed that diffuses the pockets of higher concentrations of the implanted dopant more uniformly throughout the polysilicon resistor 306.

FIG. 3C illustrates the polysilicon resistor device 300 after formation of contacts 316 in accordance with an aspect of the present invention. The polysilicon resistor 306 has a resistance that is a factor of the exposed percentage of the exposure pattern of the resistor mask, the thickness of the polysilicon layer, and the dose and dopant employed in the ion implantation 314. The polysilicon thickness and ion implantation characteristics may be fixed, but even so, the exposure pattern can be varied to obtain a desired/selected sheet resistance.

The contacts 316 are formed of a conductive material, such as aluminum, tungsten or copper, and provide electrical communication to other electronic components. In FIG. 3C, the contacts 316 are positioned at ends of the polysilicon resistor 306 and, therefore, provide full resistance of the polysilicon resistor. It is appreciated that the contacts 316 can be placed nearer each other in accordance with the present invention thereby reducing the amount or resistance between the contacts 316.

Figure 4:
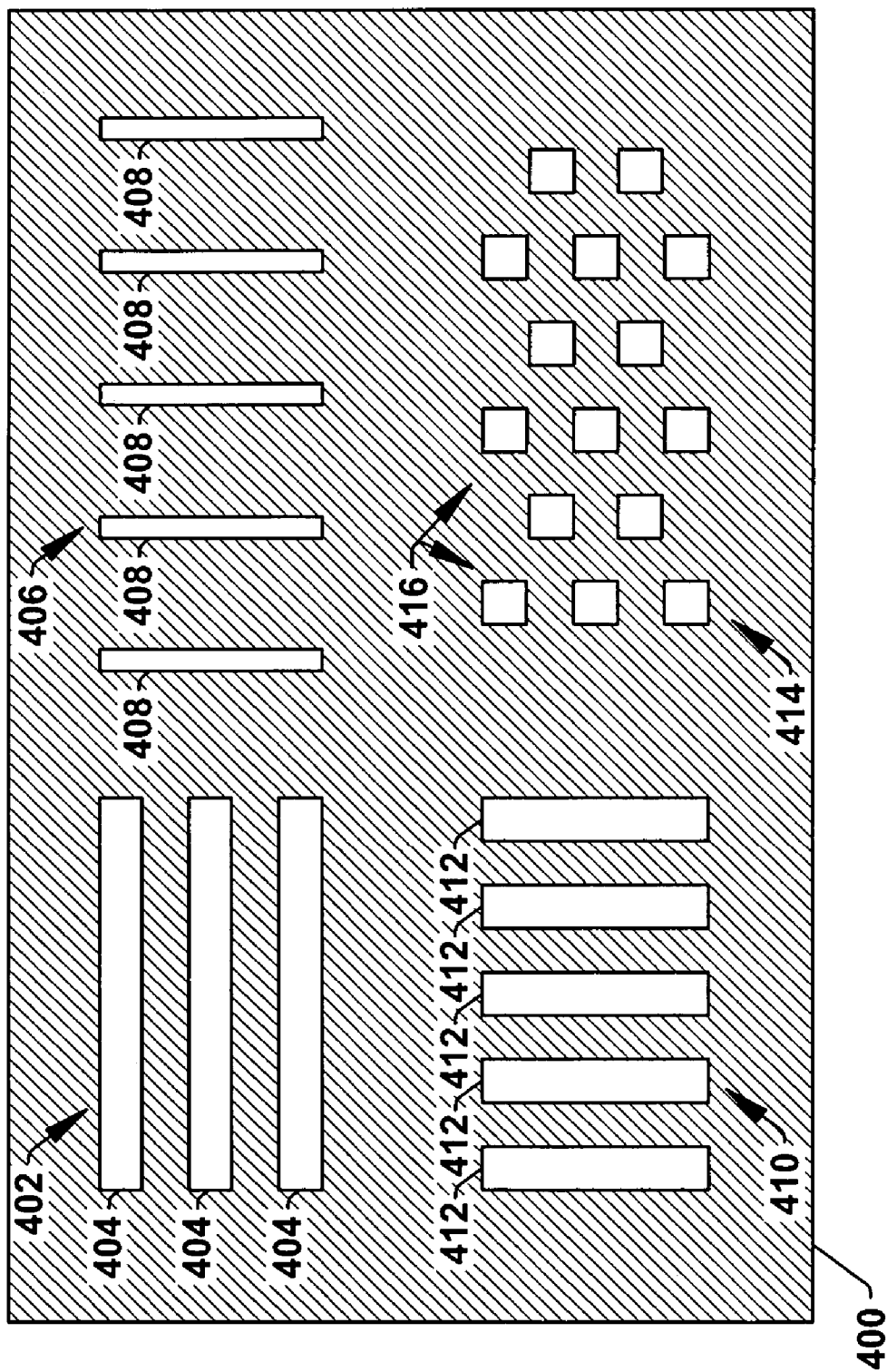
FIG. 4 is a plan view of a polysilicon resistor mask in accordance with an aspect of the present invention.

FIG. 4 is a plan view of a polysilicon resistor mask 400 in accordance with an aspect of the invention. This view illustrates some exemplary exposure patterns for controlling sheet resistance for polysilicon resistors. It is appreciated that the resistor mask 400 is provided for exemplary purposes in order to facilitate understanding of the present invention and that the present invention is not limited to the resistor mask 400 and patterns depicted therein.

A first exposure pattern 402 comprises three openings 404, which are shaped in relatively long rows over an underlying polysilicon resistor (not shown). A second exposure pattern 406 comprises five openings 408, which are shaped in relatively narrow vertical columns, over another underlying polysilicon resistor (not shown). A third exposure pattern 410 also comprises five openings 412, which are shaped in relatively thick vertical columns, over yet another underlying polysilicon resistor (not shown). The five openings 412 are relatively thicker than the openings 408, and provide more exposure to ion implantations that are performed. Consequently, the same ion implantation process will form a higher concentration of implanted ions for underlying polysilicon resistors with the third exposure pattern 410 than the second exposure pattern 406. A fourth exposure pattern 414 includes a number of openings 416 shaped as squares and arranged in a checkerboard pattern.

It is appreciated that exposure patterns for resistor masks in accordance with the present invention can have other shapes and configurations in addition to those described above. For example, the openings can include circular shapes, triangles, rectangles, and other geometric shapes. The resistor mask 400 also demonstrates that multiple polysilicon resistors can be formed concurrently with varied resistivity due to the varied exposure patterns above.

Figure 5:
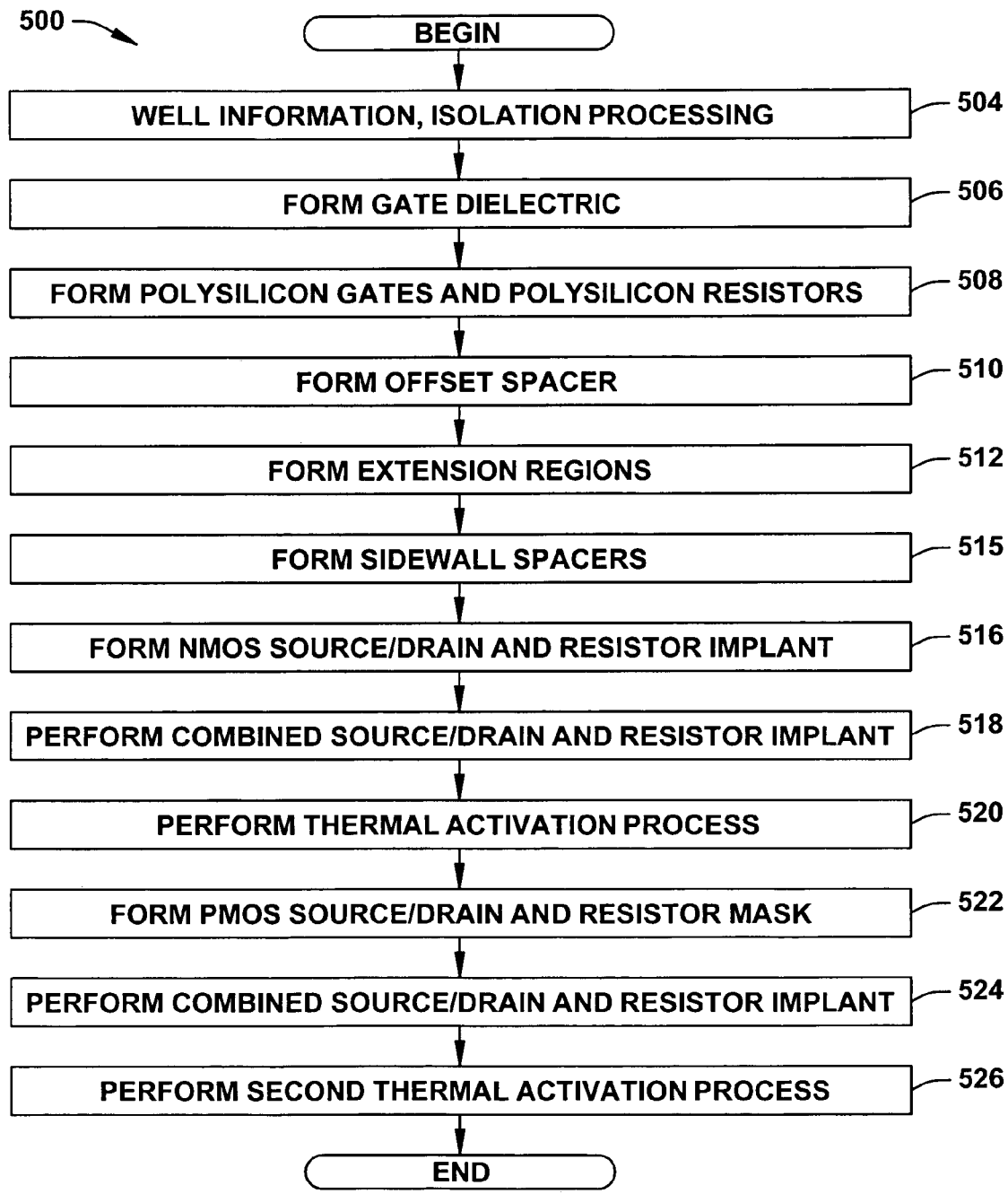
FIG. 5 is a flow diagram illustrating a method of fabricating a CMOS device with polysilicon resistors in accordance with an aspect of the present invention.

FIG. 5 is a flow diagram illustrating a method 500 of fabricating a CMOS device with polysilicon resistors in accordance with an aspect of the present invention. While the exemplary method 500 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 500 begins at block 504, wherein transistor fabrication is initiated, and transistor well formation and isolation processing thereby defining NMOS, PMOS regions, and polysilicon resistor regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another. One or more of the isolation regions serve as a basis for forming the polysilicon resistors.

The method 500 continues at block 506, wherein a gate dielectric layer is formed in active areas defined by the various formed isolation regions. In one example, the gate dielectric comprises a thin, thermally grown silicon dioxide layer, however, other type gate dielectrics (such as high-k dielectrics) may be formed and are contemplated by the present invention. A polysilicon layer is then deposited over the device at block 508 and patterned to form a polysilicon gates within the NMOS and PMOS regions and to form polysilicon resistors in the resistor region. For example, a polysilicon layer may be deposited via chemical vapor deposition (CVD) and patterned via etching to form polysilicon electrodes in both NMOS and PMOS regions and the polysilicon resistors in the resistor region. It is noted that the thickness of the polysilicon resistors, in this example, is dependent upon the desired thickness for the polysilicon gates.

An offset spacer is then formed on lateral edges of the polysilicon gates at block 510. For example, a thin offset layer (e.g., an oxide or nitride layer) is formed generally conformally over the patterned gate and then etched using a generally anisotropic dry etch to remove offset layer material on top of the gate, the source/drain regions, and the resistor regions, leaving a thin offset spacer material on lateral edges of the gate.

An extension region implant is then performed at block 512 to form extension regions, wherein dopants are introduced in active regions of the NMOS and PMOS regions. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 5, sidewall spacers are then formed on the gate structures at block 514. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure, the moat or active area, and the resistor region, and leaving a region on the lateral edges of the gate structure, overlying the offset spacers. The sidewall spacers are substantially thicker than the offset spacers, thereby resulting in the subsequently formed source/drain regions to be offset from lateral edges of the gate.

An NMOS source/drain and resistor mask is formed on the device at block 516. The NMOS source/drain and resistor mask covers portions of the device with resist and exposes source/drain regions within the NMOS region and partially exposes polysilicon resistors within the resistor region. The mask has exposure patterns for each of the polysilicon resistors within the resistor region that may or may not have different amounts of exposure, different shaped openings, and different arrangements of the openings.

A combined source/drain and polysilicon resistor implant with an n-type dopant (e.g., BF2) is performed at block 518. The dopant is implanted with a dose and energy generally selected according to desired operational properties of the source/drain regions within the NMOS region. The amount of dopant implanted within the polysilicon resistors is a function of the exposure patterns of the NMOS source/drain and resistor mask in addition to the dose and energy of the implant at block 518. The dopants implanted within the polysilicon resistors are non-uniformly distributed and have pockets of higher than desired dopant concentration. After the implant, the NMOS source/drain and resistor mask is removed.

Subsequently, a thermal activation process is performed at block 520 that activates the implanted dopants within the source/drain regions of the NMOS region and also diffuses the implanted dopants within the polysilicon resistors. A suitable thermal process is a rapid thermal anneal performed for a relatively short duration. The high diffusability of polysilicon and the thermal process cause the implanted dopants within the polysilicon resistors to more uniformly distribute throughout the polysilicon resistors.

A PMOS source/drain and resistor mask is formed on the device at block 522. The PMOS source/drain and resistor mask covers portions of the device with resist and exposes source/drain regions within the PMOS region and partially exposes zero or more polysilicon resistors within the resistor region. The mask has exposure patterns for possibly some of the polysilicon resistors within the resistor region, while some or all of the polysilicon resistors may be covered by the mask. Some of these exposure patterns may or may not have different amounts of exposure, different shaped openings, and different arrangements of the openings.

Low temperature coefficient resistors, as described above, are obtained with polysilicon resistors by implanting both n-type and p-type dopants. Generally, a resultant concentration of n-type dopants is slightly higher. The presence of both dopants allows a relatively large number of dopants to be implanted while maintaining a high sheet resistance. Additionally, this sheet resistance has a lower temperature coefficient and thus, is not as susceptible to changes in resistance due to changes in temperature. The polysilicon resistors that have associated exposure patterns in the PMOS source/drain and resistor mask are formed as low temperature coefficient poly resistors. Furthermore, it is noted that the percentage of exposure or openings for these resistors is typically larger than other formed polysilicon resistors.

A combined source/drain and polysilicon resistor implant with a p-type (e.g., boron) dopant is performed at block 524. The dopant is implanted with a dose and energy generally selected according to desired operational properties of the source/drain regions within the NMOS region. The amount of dopant implanted within the polysilicon resistors is a function of the exposure patterns of the NMOS source/drain and resistor mask in addition to the dose and energy of the implant at block 524. After the implant, the PMOS source/drain and resistor mask is removed.

Subsequently, a thermal activation process is performed at block 526 that activates the implanted dopants from block 524 within the source/drain regions of the PMOS region and also diffuses the implanted dopants within the low temperature coefficient polysilicon resistors. Similar to the thermal activation process performed at block 520, the thermal process at block 526 along with the relatively high diffusability of polysilicon causes the p-type implanted dopants within the polysilicon resistors to more uniformly distribute throughout the polysilicon resistors.

Subsequently, other features and/or components of the device can be formed. Conductive contacts are formed through a PMD layer to provide electrical connection for the transistor terminals and the polysilicon resistors. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material. Other typical back-end processing may be performed including hydrogen sintering and other processes that impact stress induced by the strain inducing liner.

Figure 6A:
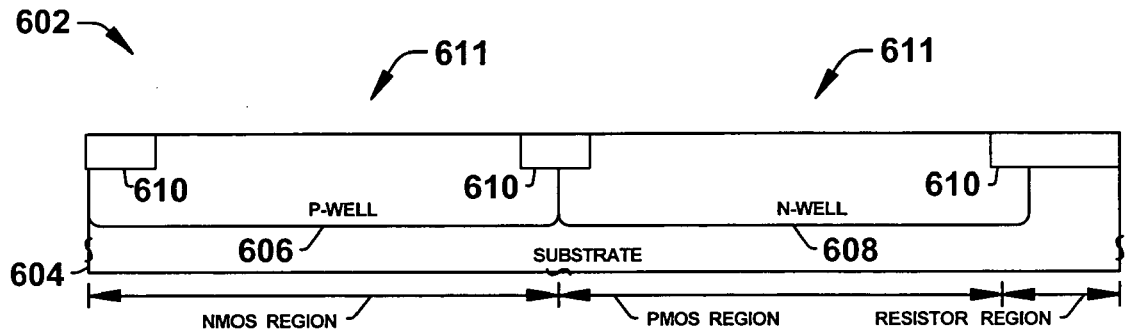
FIGS. 6A-6K are a plurality of fragmentary cross section diagrams illustrating a transistor device being formed in accordance with the present invention by the method of FIG. 5.
Figure 6B:
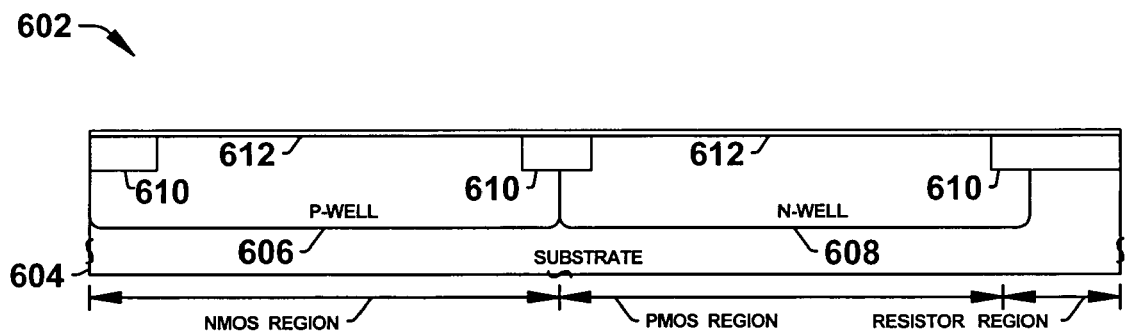

Turning now to FIGS. 6A-6K, a plurality of fragmentary cross section diagrams illustrating a transistor device being formed in accordance with the present invention by the method 500 of FIG. 5 is provided. In FIG. 6A, a transistor device 602 is provided, wherein a semiconductor body 604, such as a semiconductor substrate, has a number of wells formed therein, such as a P-well region 606 to define an NMOS transistor device region and an N-well region 608 to define a PMOS transistor device region, respectively. Further, isolation regions 610 such as STI regions are formed in the semiconductor body to define active area regions 611 and serve as a base for polysilicon resistor formation. In FIG. 6B, the transistor device 602 is illustrated, wherein a gate dielectric 612 has been formed, for example, by thermally grown $SiO_2$, over the active areas 611.

Figure 6C:
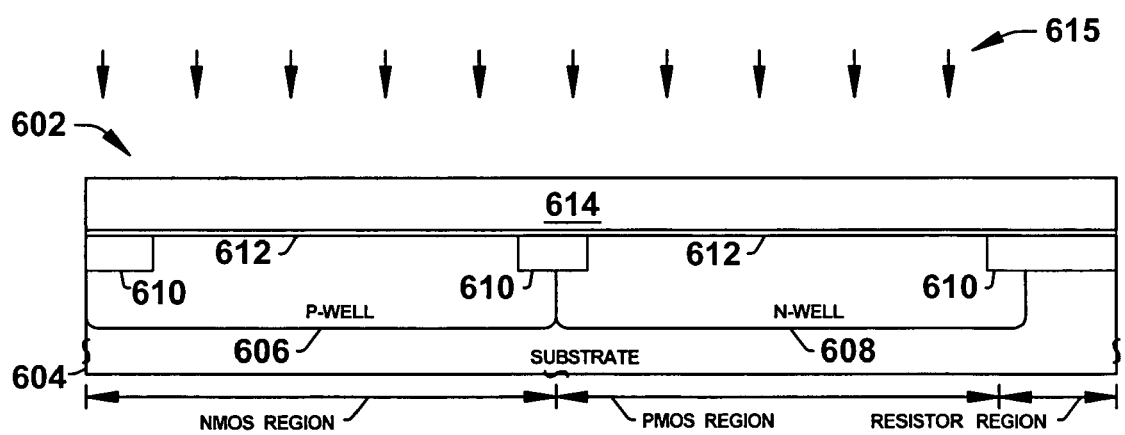
Figure 6D:
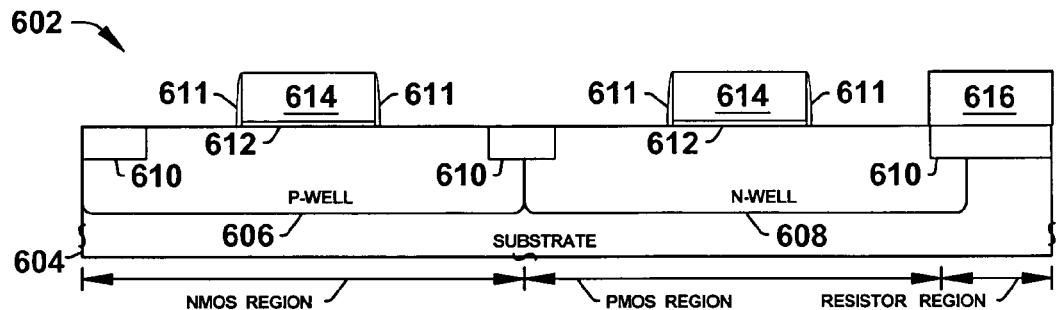

Referring to FIG. 6C, a polysilicon layer 614 has been formed overlying the gate dielectric 612. Turning now to FIG. 6D, the polysilicon layer 614 and the gate dielectric layer 612 are patterned to form gate structures within the NMOS and PMOS region and polysilicon resistors 616 within the resistor region. Additionally, offset spacers 611 are formed on the lateral edges of the gate structures. The offset spacers 611 are comprised of an insulative material, such as nitride or oxide, and are relatively thin. The offset spacers 611 operate to protect the gates 614 and to align and define subsequently formed regions.

Figure 6E:
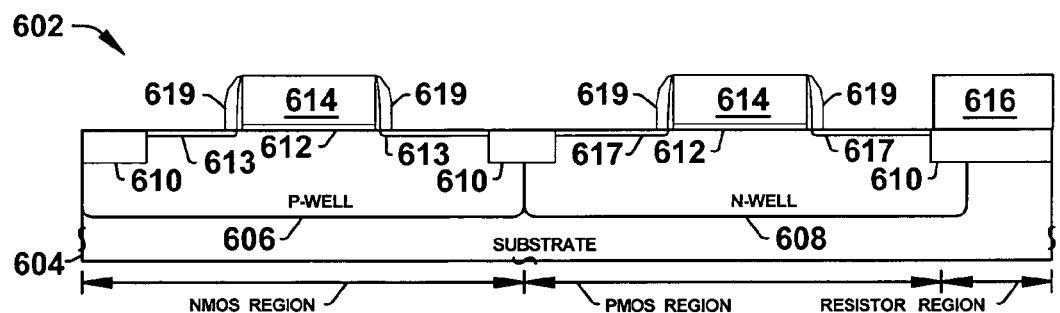

Turning now to FIG. 6E, NMOS extension regions 613 are formed within the NMOS region by selectively implanting n-type dopant(s) with a relatively low energy into active areas of the NMOS region. Typically, a mask is employed to prevent implantation within the PMOS region during this implantation. Then, PMOS extension regions 617 are formed within the PMOS region by selectively implanting p-type dopant(s) with a relatively low energy into active areas of the PMOS region. Again, a resist mask is employed to prevent implantation within the NMOS region during this process. Additionally, sidewall spacers 619 are formed on lateral edges of the gate structures by depositing an insulative material (e.g., oxide or nitride) in a generally conformal manner over the device and subsequently performing an anisotropic etch to remove the insulating material on top of the gate structures, active areas, and polysilicon resistors, leaving sidewall spacers 619 as illustrated in FIG. 6E.

Figure 6F:
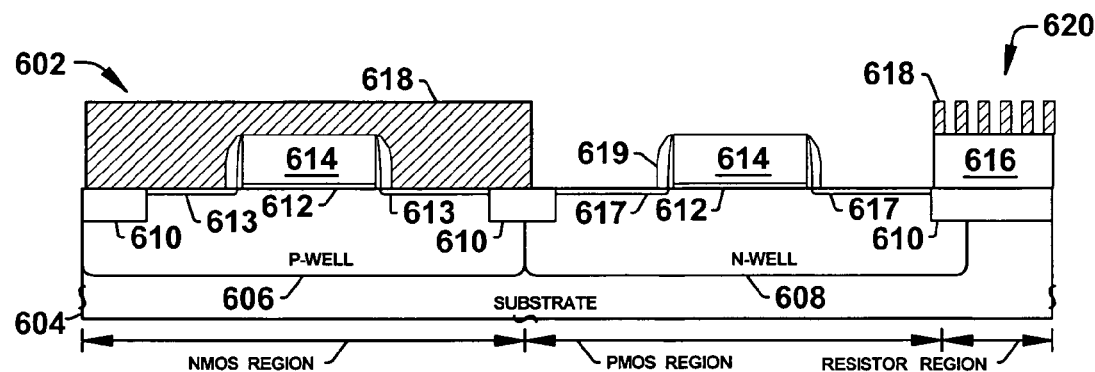

A PMOS source/drain and resistor mask 618 is formed over the device exposing the PMOS region and partially exposes polysilicon resistors 616 within the resistor region as shown in FIG. 6F. The mask 618 has exposure patterns 620 for some of the polysilicon resistors within the resistor region. In alternate aspects of the invention, the polysilicon resistors 616 are not exposed by the mask 618.

Figure 6G:
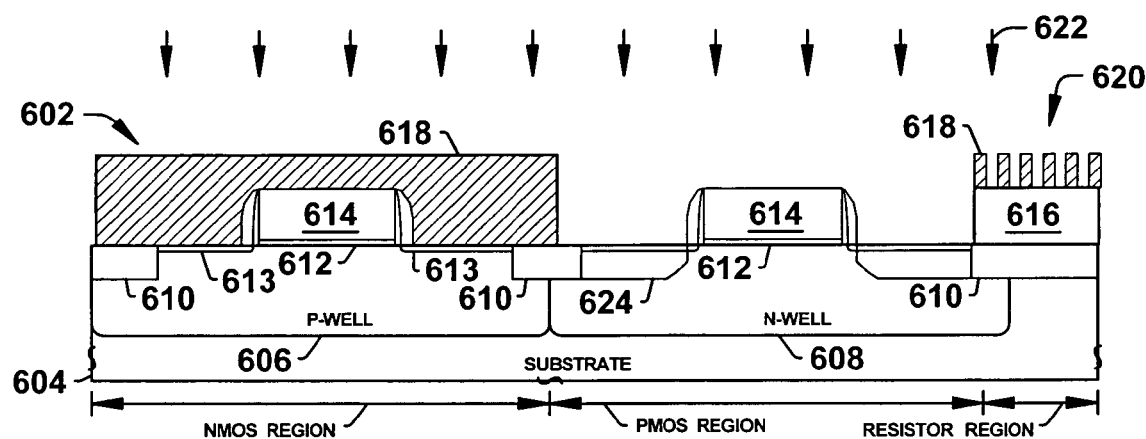

FIG. 6G depicts an ion implantation process 622 that implants p-type dopant(s) into the active areas of the PMOS region and into the polysilicon resistors 616. The exposure patterns 620 within the resistor mask 618 limit the amount of dopant(s) that pass through to underlying polysilicon resistors 616. The ion implantation process 622 forms source/drain regions 624 within the PMOS region and alters or adjusts resistivity of the polysilicon resistors 616. Once the implantation process 622 is completed, the resistor mask 618 is removed.

Figure 6H:
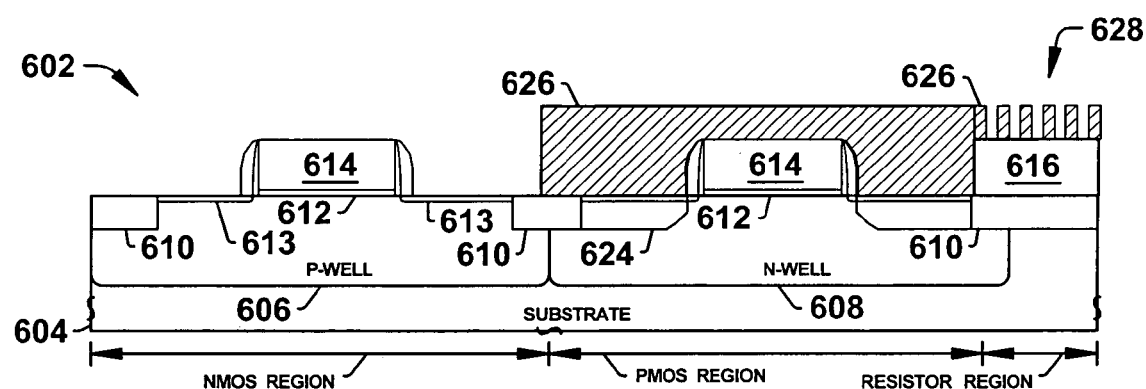

An NMOS source/drain and resistor mask 626 is formed over the device exposing the NMOS region and partially exposes polysilicon resistors 616 within the resistor region as shown in FIG. 6H. The mask 626 has exposure patterns 628 for some of the polysilicon resistors within the resistor region.

Figure 6I:
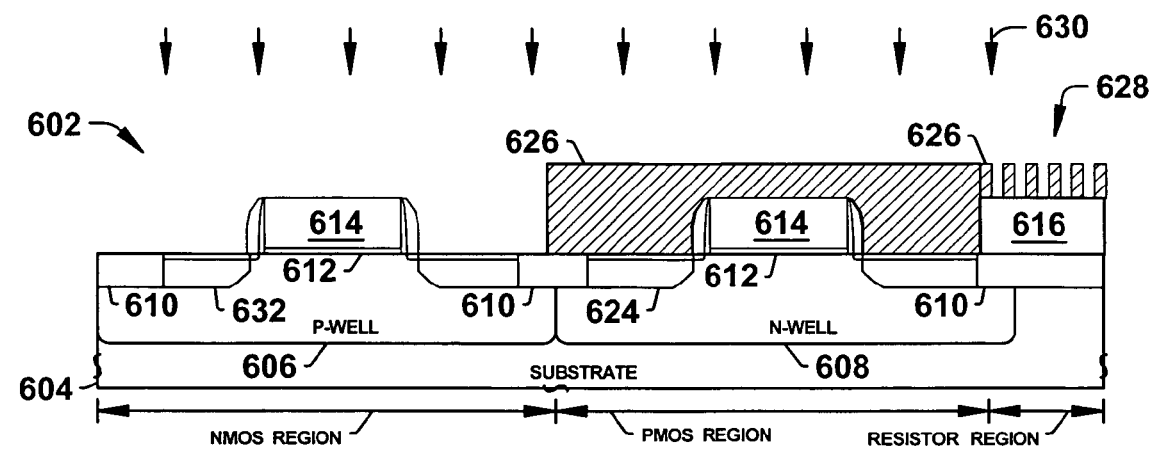

FIG. 6I depicts an ion implantation process 630 that implants n-type dopant(s) into the active areas of the NMOS region and into the polysilicon resistors 616. The exposure patterns 628 within the resistor mask 626 limit the amount of dopant(s) that pass through to underlying polysilicon resistors 616. The ion implantation process 630 forms source/drain regions 632 within the NMOS region and alters or adjusts resistivity of the polysilicon resistors 616. After the implantation process 630 is completed, the resistor mask 626 is removed.

It is noted that this description describes implanting both n-type and p-type dopants into the polysilicon resistors 616. So doing can fabricate the resistors 616 so as to be low coefficient of temperature resistors, meaning that their resistivity is altered less by temperature. However, alternate aspects of the invention include forming polysilicon resistors having a single type of conductivity.

Figure 6J:
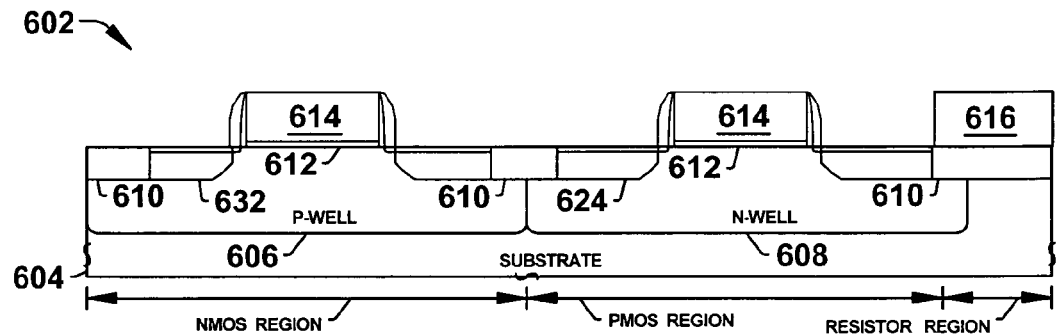

Subsequently, thermal activation processes are performed that diffuse and activate dopant(s) within the source drain regions of the PMOS and NMOS regions and within the polysilicon resistors 616 in FIG. 6J. The implanted dopant(s) within the polysilicon resistors 616 are diffused to have a more uniform profile or concentration of dopant(s) throughout the resistors 616. It is noted that prior to the thermal activation process, the implanted dopant(s) within the polysilicon resistors 616 exist in pockets of higher than desired concentration.

Figure 6K:
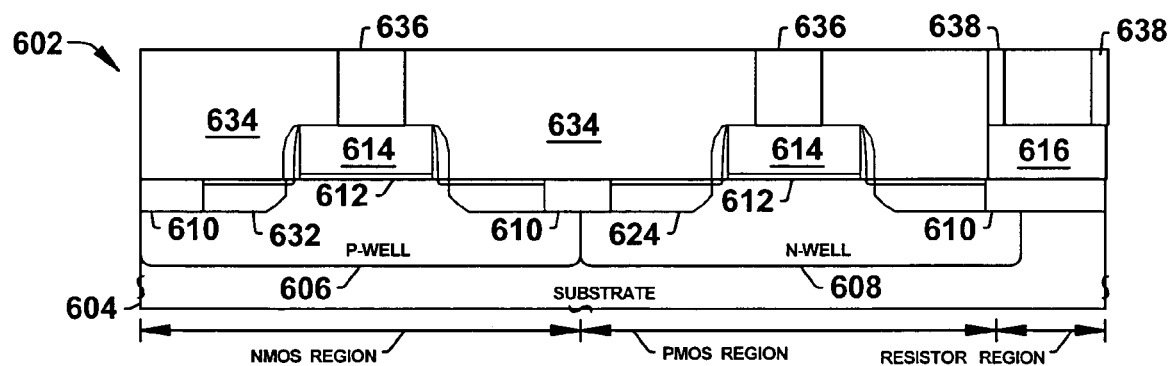

FIG. 6K depicts formation of contacts to the device 602. An insulative, protective layer 634 is formed over the device 602. The layer 634 can, for example, be a PMD layer or an interlayer dielectric layer (ILD). Contact holes are formed in the insulative layer 634, which are then filled with conductive material to form contacts. As shown in FIG. 6K, contacts 636 are formed to polysilicon gates 614 in the NMOS and PMOS regions. Additionally, resistor contacts 638 are formed on or near ends of the polysilicon resistors.

Subsequently, other features and/or components of the device can be formed. One or more metallization levels are layers can be formed to provide electrical interconnection of the various electrical components in the device, wherein each metallization level includes an inter-level or inter-layer (ILD) dielectric formed over a preceding level, with vias and/or trenches formed therein and filled with a conductive material. Other typical back-end processing may be performed including hydrogen sintering and other processes that impact stress induced by the strain inducing liner.

It is noted that the semiconductor device depicted in FIGS. 6A to 6K is exemplary in nature and intended to facilitate an understanding of the present invention. It is appreciated that variations in thicknesses, layers formed, dimensions, materials employed, and the like are permitted and contemplated in accordance with the present invention.

While, for purposes of simplicity of explanation, the methodologies of FIGS. 1, 2 and 5 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of forming a polysilicon resistor device comprising:
   forming an insulative layer over a semiconductor substrate;
   forming a polysilicon layer on the insulative layer;
   defining at least a portion of the polysilicon layer as a polysilicon resistor;
   forming a resistor mask having an exposure pattern on the polysilicon layer, wherein the exposure pattern exposes a portion of the polysilicon resistor;
   implanting a selected dopant into the polysilicon layer through the exposure pattern;
   forming a second resistor mask having a second exposure pattern on the polysilicon layer; and
   implanting a second dopant into the polysilicon layer through the second exposure pattern, wherein the second dopant is of an opposite conductivity type than the selected dopant; and
   performing a thermal activation process that diffuses the implanted dopant in the polysilicon layer.

2. The method of claim 1, wherein the insulative layer is oxide.

3. The method of claim 1, wherein the formed polysilicon layer is undoped.

4. The method of claim 1, wherein the formed polysilicon layer is lightly doped.

5. The method of claim 1, wherein forming the resistor mask comprises forming an exposure pattern having a selected percent of exposure.

6. The method of claim 1, further comprising selecting a percent of exposure that yields a desired resistivity for the device.

7. The method of claim 6, further comprising selecting the exposure pattern having the selected percent of exposure prior to forming the resistor mask.

8. The method of claim 1, further comprising removing the resistor mask.

9. The method of claim 1, further comprising forming contacts on ends of the polysilicon layer.

10. The method of claim 1, wherein forming the resistor mask further comprises forming a resistor mask having a plurality of exposure patterns corresponding to a plurality of individual resistors.

11. A method of forming a polysilicon resistor device having a low temperature coefficient of resistivity comprising:
    forming an insulative layer over a semiconductor substrate;
    forming a polysilicon layer on the insulative layer;
    forming a first resistor mask having a first exposure pattern on the polysilicon layer;
    implanting a first dopant into the polysilicon layer through the first exposure pattern;
    performing a first thermal activation process that diffuses the implanted first dopant to a substantially uniform concentration in the polysilicon layer;
    removing the first resistor mask;
    forming a second resistor mask having a second exposure pattern on the polysilicon layer
    implanting a second dopant of opposite conductivity type to the first dopant into the polysilicon layer through the second exposure pattern;
    performing a second thermal activation process that diffuses the implanted second dopant to a substantially uniform concentration in the polysilicon layer; and
    removing the second resistor mask.

12. The method of claim 11, wherein the first exposure pattern and the second exposure pattern are equal.

13. The method of claim 11, further comprising selecting a desired resistivity and a desired temperature coefficient prior to forming the first resistor mask.

14. The method of claim 13, further comprising selecting a concentration for the first dopant and a desired concentration for the second dopant according to the desired resistivity and the desired temperature coefficient.

15. The method of claim 14, further comprising selecting the first exposure pattern according to the selected concentration for the first dopant and selecting the second exposure pattern according to the selected concentration for the second dopant.

16. A method of forming a polysilicon resistor device comprising:
    forming an insulative layer over a semiconductor substrate;
    forming a polysilicon layer on the insulative layer;
    defining a plurality of polysilicon resistors within the polysilicon layer;
    forming a resistor mask having a plurality of exposure patterns on the polysilicon layer, wherein the plurality of exposure patterns are associated with and formed over the plurality of polysilicon resistors;
    implanting a first selected dopant into the polysilicon layer through the exposure patterns;
    implanting a second selected dopant different than the first dopant into the polysilicon layer through the exposure patterns; and
    performing a thermal activation process that diffuses the implanted dopant in the polysilicon layer.

17. The method of claim 16, wherein defining a plurality of polysilicon resistors comprises patterning the polysilicon layer.

18. The method of claim 16, further comprising selecting exposure patterns according to desired sheet resistances for the plurality of polysilicon resistors.

19. A method of fabricating a semiconductor device having polysilicon resistors comprising:
    performing well formation and isolation processing in a semiconductor body in NMOS and PMOS regions;
    forming a gate dielectric layer on the semiconductor body;
    forming a polysilicon layer on the gate dielectric layer;
    patterning the polysilicon layer to form polysilicon gates in the NMOS and PMOS regions and polysilicon resistors in a resistor region;
    forming offset spacers adjacent to the polysilicon gates in the NMOS and PMOS regions;
    forming extension regions in active areas in the NMOS and PMOS regions;
    forming sidewall spacers adjacent the offset spacers;
    forming an NMOS source/drain and resistor mask that covers the PMOS region and exposes the NMOS region and partially exposes polysilicon resistors within the resistor region;
    implanting n-type dopant(s) to form source/drain regions in the NMOS region and adjust resistivity of the polysilicon resistors;
    removing the NMOS source/drain and resistor mask;
    forming a PMOS source/drain and resistor mask that covers the NMOS region and exposes the PMOS region;
    implanting p-type dopant(s) to form source/drain regions in the PMOS region; and
    removing the PMOS source/drain and resistor mask.

20. The method of claim 19, wherein the n-type dopant(s) is BF2.

21. The method of claim 19, wherein forming the polysilicon layer comprises forming doped polysilicon.

22. The method of claim 19, wherein forming the NMOS source/drain and resistor mask comprises forming exposure patterns associated with the polysilicon resistors.

23. The method of claim 19, wherein forming the PMOS source/drain and resistor mask further comprises partially exposing the polysilicon resistors within the resistor region.

* * * * *